US006038265A

United States Patent [19]

Pan et al.

[11] Patent Number: 6,038,265

[45] Date of Patent: Mar. 14, 2000

[54] APPARATUS FOR AMPLIFYING A SIGNAL USING DIGITAL PULSE WIDTH MODULATORS

[75] Inventors: Shaowei Pan, Lake Zurich; Shay-Ping T. Wang, Long Grove; Jeffrey G. Toler, Algonquin, all of Ill.; Stephen Chih-Hung Ma, Mesa, Ariz.

[73] Assignee: Motorola, Inc., Schaumburg, Ill.

[21] Appl. No.: 08/936,306

[22] Filed: Sep. 24, 1997

Related U.S. Application Data

[63] Continuation-in-part of application No. 08/845,221, Apr. 17, 1997, abandoned.

[51] Int. Cl.[7] .............................. H03K 9/00; H03K 7/08; H03C 3/00

[52] U.S. Cl. ........................... 375/316; 375/238; 332/119

[58] Field of Search ..................................... 375/316, 238; 332/117, 119, 149, 151, 108; 455/102, 110, 112

[56] References Cited

U.S. PATENT DOCUMENTS

| | | | |
|---|---|---|---|
| 4,352,154 | 9/1982 | Reiber | 363/123 |
| 4,931,751 | 6/1990 | Keller et al. | 332/108 |
| 5,148,168 | 9/1992 | Masuda et al. | 341/152 |
| 5,311,548 | 5/1994 | Nikolaus | 375/238 |
| 5,553,012 | 9/1996 | Buss et al. | 364/722 |
| 5,774,084 | 6/1998 | Brombaugh et al. | 341/152 |

*Primary Examiner*—Chi H. Pham
*Assistant Examiner*—Khai Tran
*Attorney, Agent, or Firm*—James E. Gauger; James E. Klekotka

[57] ABSTRACT

An electronic apparatus that includes a digital processor (12), a first digital pulse width modulator (304), a second digital pulse width modulator (306), a combining circuit (308), and a load (310). The digital processor (12) produces a first digital signal (314) and a second digital signal (316). The first digital pulse width modulator (304) is responsive to the first digital signal (314), and the second digital pulse width modulator (306) is responsive to the second digital signal (316). The combining circuit (308) is responsive to the first digital pulse width modulator (304) and the second digital pulse width modulator (306). The load (310) is responsive to the combining circuit (308).

19 Claims, 6 Drawing Sheets

APPARATUS FOR AMPLIFYING A SIGNAL USING DIGITAL PULSE WIDTH MODULATORS

CROSS REFERENCES

The present application is a continuation in part of patent application Ser. No. 08/845,221, docket number MNE00464N, Pan et al. filed Apr. 17, 1997, now abandoned. The entire contents of the above application is incorporated by reference herein.

FIELD OF THE INVENTION

The present invention relates generally to a high efficiency electronic apparatus using at least one digital pulse width modulator.

BACKGROUND OF THE INVENTION

There are various apparatus available for amplifying signals. In amplifier applications that involve the amplification and transmission of modulated signals, a premium is placed on amplifier efficiency. In communication equipment, a radio frequency power amplifier consumes a large amount of the power for the equipment. For example, in cellular telephones and in base stations, the power amplifier may dissipate more than half of the supplied power. Traditionally, efficiency of the power amplifier in such applications varies from about 5% to about 25% depending upon the peak-to-average ratio of the transmitted signals. An increase in the efficiency of the power amplifier would lead to greatly improved product results, such as improved talk time in a cellular phone.

Accordingly, there is a great need for a more efficient apparatus for amplifying signals.

BRIEF DESCRIPTION OF THE DRAWINGS

The invention is pointed out with particularity in the appended claims. However, other features of the invention may become more apparent and certain aspects of the invention may be better understood by referring to the following detailed description in conjunction with the accompanying drawings in which:

DETAILED DESCRIPTION OF THE PREFERRED EMBODIMENT(S)

Generally, the present invention addresses the above identified need to provide a more efficient apparatus for amplifying signals. In accordance with a first aspect of the present invention, the apparatus includes a digital processor, a first digital pulse width modulator, a second digital pulse width modulator, a combining circuit, and an output load. The digital processor produces a first digital signal and a second digital signal. The first digital pulse width modulator is responsive to the first digital signal, and the second digital pulse width modulator is responsive to the second digital signal. The combining circuit is responsive to the first digital pulse width modulator and the second digital pulse width modulator. The output load is responsive to the combining circuit.

In accordance with another aspect of the invention, the digital processor is a logarithm based processor that includes a logarithm converter, digital logic, and an inverse logarithm converter.

Figure 1:
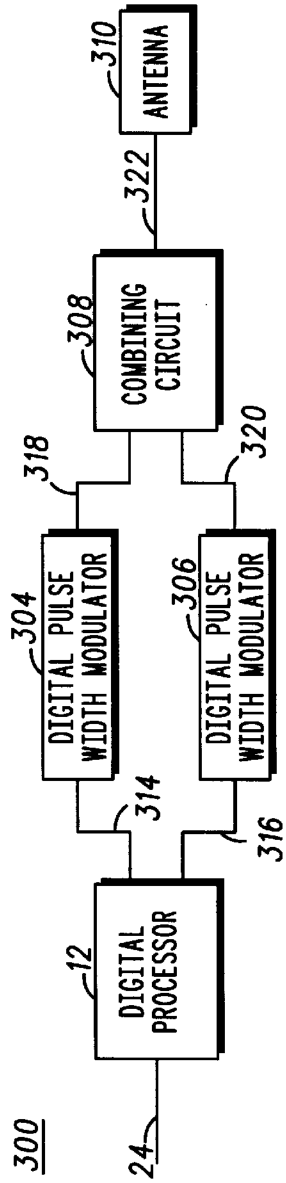
FIG. 1 is a block diagram of an embodiment of an apparatus for amplifying signals in accordance with the present invention.

Referring to FIG. 1, a block diagram of an illustrative embodiment of an apparatus 300 for amplifying signals is illustrated. The apparatus 300 includes a digital processor 12, a first digital pulse width modulator 304, a second digital pulse width modulator 306, a combining circuit 308, and an output load, such as an antenna 310. The first and second digital pulse width modulators 304, 306 are each responsive to the digital processor 12 and coupled to the combining circuit 308. The antenna 310 is responsive to the combining circuit 308.

During operation, an input signal 24, is received by the digital processor 12 that produces a first digital signal 314 and a second digital signal 316. Preferably, the input signal 24 is a baseband signal, the first digital signal 314 is an amplitude modulated signal, and the second digital signal 316 is a frequency modulated signal. The digital pulse width modulator 304 receives the first digital signal 314 and produces a first pulse width modulated signal 318. The second digital pulse width modulator 306 receives the second digital signal 316 and produces a second pulse width modulated signal 320. The combining circuit 308 receives the first and second pulse width modulated signals 318, 320 and produces a combined modulated signal 322 that is transmitted by antenna 310.

Figure 2:
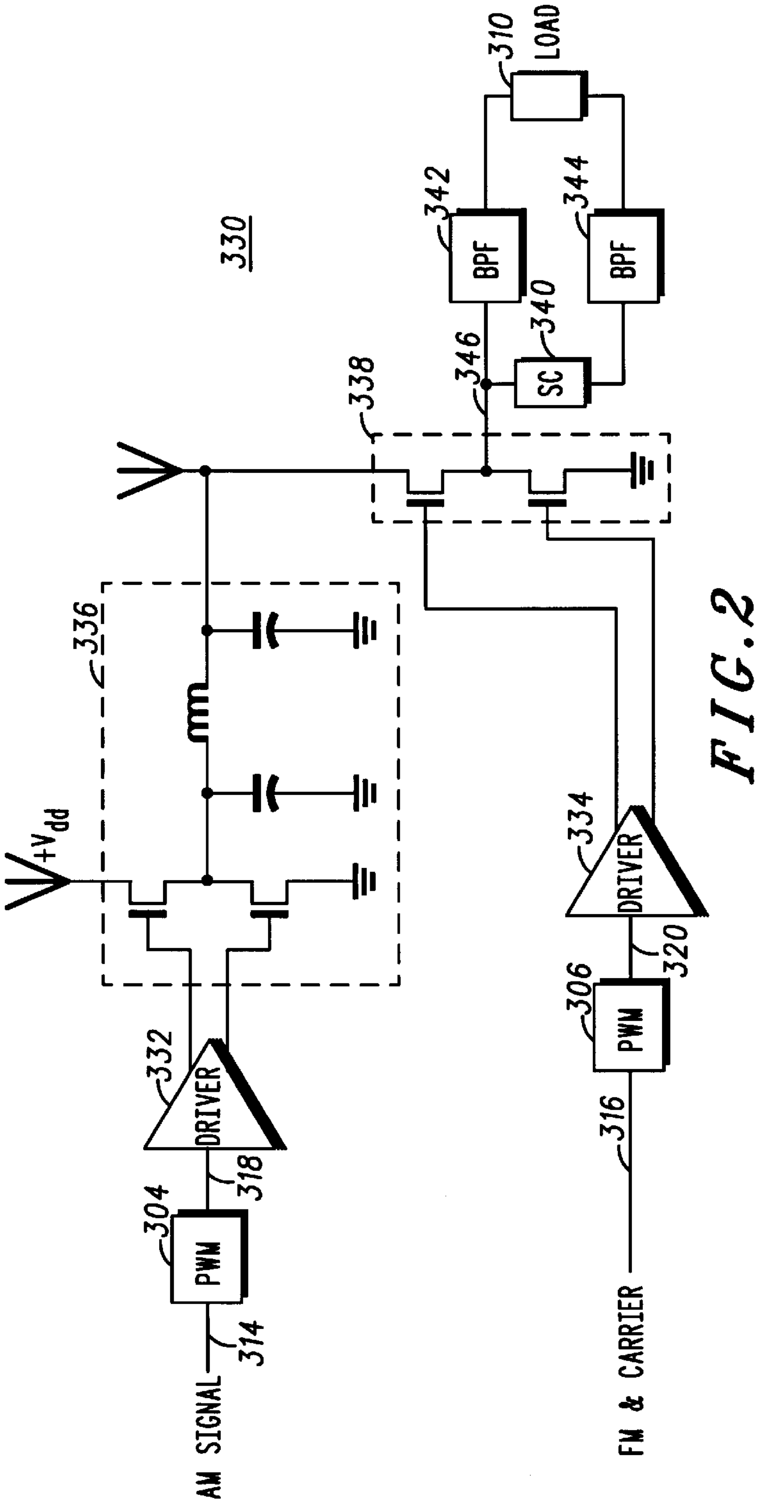
FIG. 2 is a block diagram of an embodiment of an electronic apparatus in accordance with the present invention.

Referring to FIG. 2, a particular embodiment of an electronic apparatus 330 is illustrated. The apparatus 330 includes first PWM 304, second PWM 306, and antenna 310. In the apparatus of FIG. 2, the combining circuit 308 is implemented as an analog pulse width modulator 336, a second analog pulse width modulator 338, a switch capacitance module 340, first band pass filter 342, and second band pass filter 344. The first analog pulse width modulator (PWM) 336 includes a first switching element, a second switching element, and an output filter including capacitance and inductance elements. Preferably the output filter is a fifth order low pass filter with a cutoff frequency of about 25 Khz. In the preferred embodiment the switching elements are field effect transistors. The first switching element receives a positive voltage from voltage source Vdd. The apparatus 330 further includes a first driver 332 responsive to the first digital PWM 304 and a second driver 334 responsive to the second PWM 306. Preferably the switching elements are implemented using CMOS type transistors.

During operation, the first digital PWM 304 receives amplitude modulated signal 314 and produces the first pulse width modulated signal 318 that is fed to driver 332 and passed to analog pulse width modulator 336. Frequency modulated signal 316 is pulse width modulated by PWM 306 to produce the second pulse width modulated signal 320, which is fed by second driver 334 to the second analog pulse width modulator 338. The second pulse width modulator 338 combines the signals from the first driver 332 and the second driver 334 to produce a combined modulated signal 346. The combined modulated signal 346 is fed to the first band pass filter 342 and to the switch capacitance 340. The second band pass filter receives an output of the switch capacitance 340. The first and second band pass filters 342, 344 each provide a filtered and modulated signal to a respective input of the output load 310, which is preferably an antenna. The antenna 310 then transmits the resulting filtered and modulated signals.

Figure 3:
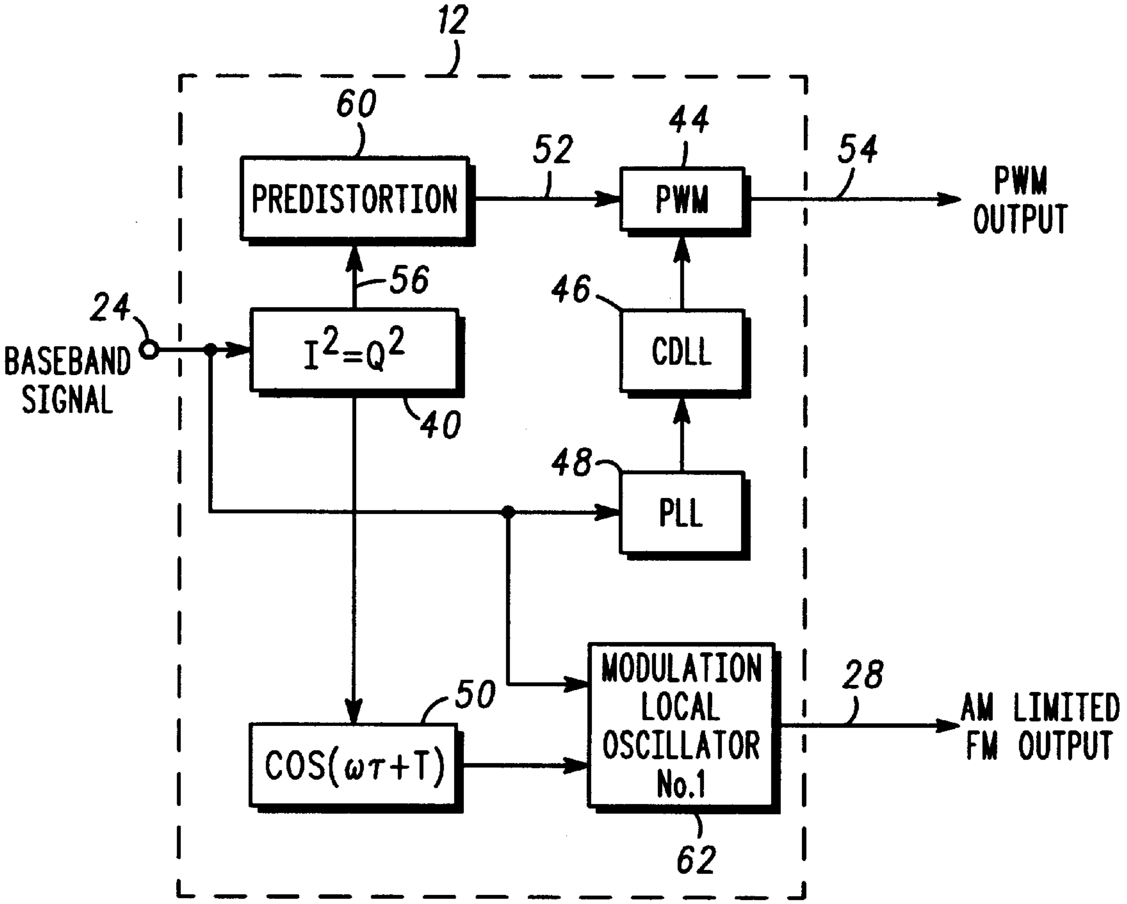
FIG. 3 is a block diagram of an exemplary embodiment of the digital processor of FIG. 1.

Referring to FIG. 3, an embodiment of the digital processor 12 is disclosed. In this embodiment, the digital processor 12 includes a predistortion generation module 60 and a digital modulator 62. The predistortion module 60 is implemented by approximating the amount of predistortion necessary for addition to the signal 56 to cancel distortion, such as induced adjacent channel interference that may be caused by phase changes, that is created by amplification within the combining circuit 308. In the preferred embodiment, the predistortion approximation is implemented using a polynomial function of the form $ax^{1/2}+bx^{3/2}+cx^{5/2}$, where a, b, c are coefficient values, such as 1.05, −0.03, 0.0038, and where x is $I^2+Q^2$.

In a particular illustrative embodiment where the baseband signal has a symbol rate of 25 Khz, a 64 to 1 PLL48 synchronizes the signal to 3.2 MHz which is carried by 6 bits. A 128 to 1 clock delay lock loop 46 sets the delay for 1/128 resolution, 7 bits, for each clock. The clock's duty cycle and rise and fall edges provide an additional two bits of resolution. The combined pulse width modulator formed from the PLL 48 and the DLL 46 has a 15 bit resolution.

Figure 4:
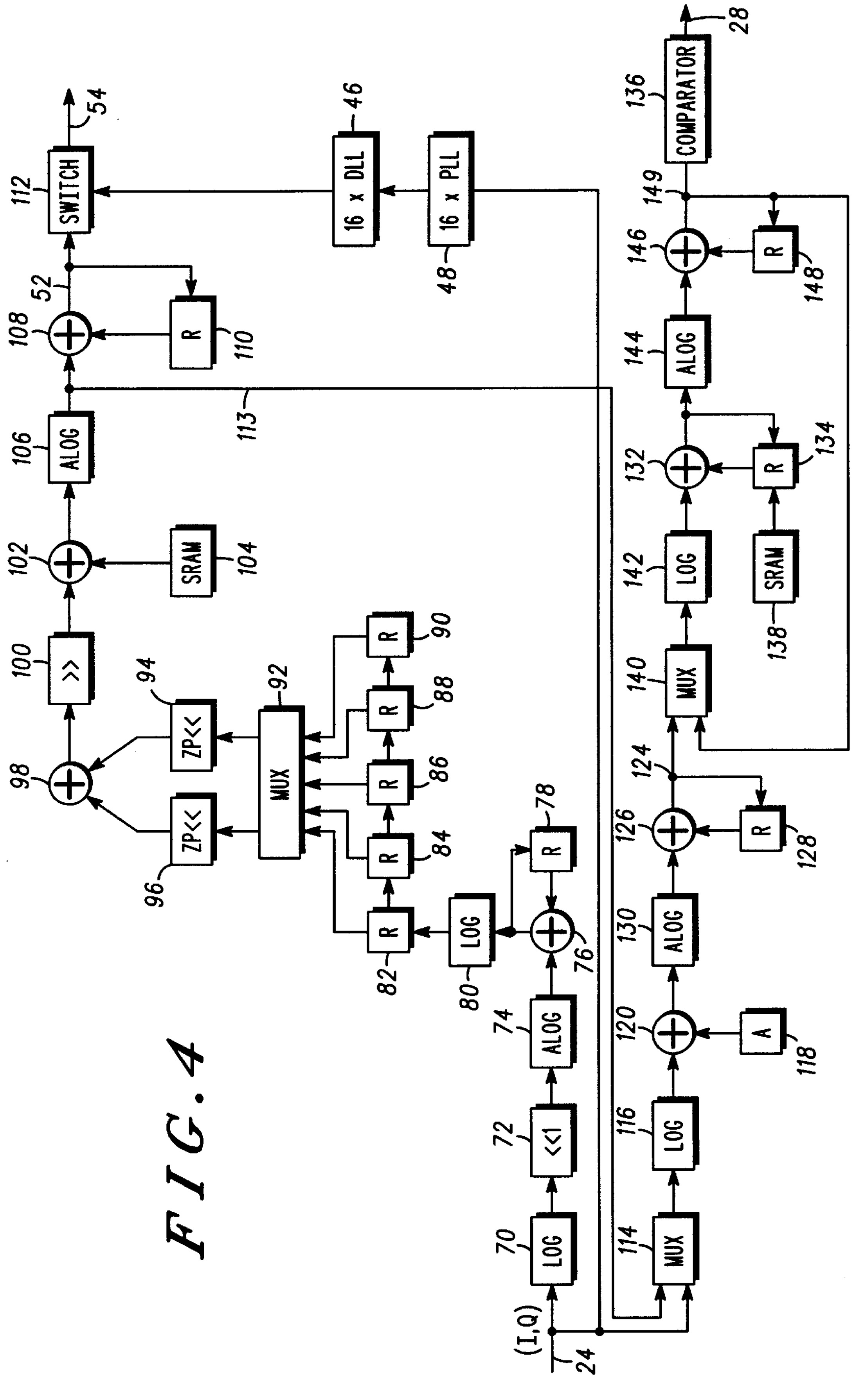
FIG. 4 is a schematic block diagram of the digital processor of FIG. 3.

Referring to FIG. 4, a more detailed schematic block diagram of a particular implementation of the digital processor 12 is disclosed. In this embodiment, the digital processor 12 is a parallel operation distributed logarithm based processor. The processor 12 includes a sum of squares module, such as sum of squares module 40 implemented as a first logarithm system including a first logarithm converter 70, a bit shifting device 72, an anti-logarithm converter 74, a summer 76, and a register 78. The processor 12 further includes an envelope extraction and predistortion module 60 implemented with a second logarithm processing system including a second logarithm converter 80, a plurality of registers 82–90, a multiplexer 92, a first zero pass (ZP) shifter 94 and a second ZP shifter 96, a summer 98, a shifter device 100, a second summer 102, a memory 104, such as a SRAM, a ROM, or a DRAM, an anti-logarithm converter 106, and an accumulating summer 108 and register 110.

The digital processor 12 further includes a logarithm based module for performing a delay matching function that includes multiplexer 114, a third logarithm converter 116, a time delay unit 118, a summer 120, a second summer 126, an inverse logarithm converter, also referred to as an anti-logarithm converter 130, an accumulating summer 126 and register 128. The processor 12 further includes a logarithm based module for performing a cosine approximation function including a multiplexer 140, logarithm converter 142, summer 132, register 134, memory 138, inverse logarithm converter 144, and accumulator including summer 146 and register 148. A comparator 136 is coupled to the output of the cosine approximation logarithm based module, which is responsive to the delay matching logarithm based module.

Finally, the digital processor 12 includes a digital pulse width modulator preferably consisting of a 16× phase lock loop 48, a 16× delay lock loop 46, and a digital switch 112.

Figure 5:
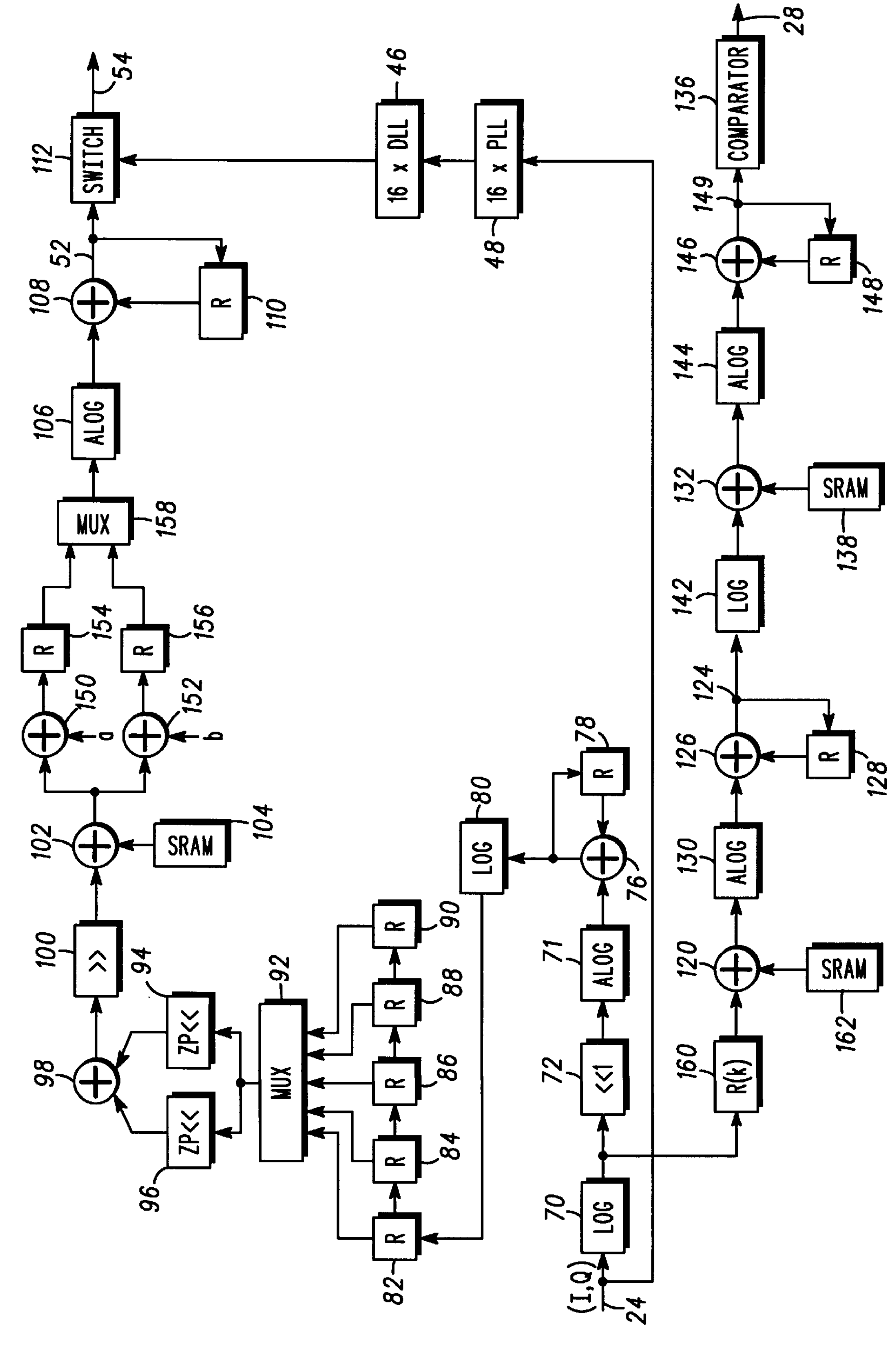
FIG. 5 is a schematic block diagram of another embodiment of the digital processor of FIG. 3.

In a presently preferred embodiment, the digital processor 12, such as the digital processor described herein in reference to FIG. 4 and FIG. 5, may be implemented as an integrated circuit, such as a high speed low power integrated circuit using complementary metal oxide semiconductor, gallium arsenide technology, or other available semiconductor technology.

The logarithm converters 70, 80, 116, 142 and the anti-logarithm converters 74, 106, 130, 144 are preferably implemented as described in prior patent application Ser. No. 08/382,467, filed Jan. 31, 1995, docket number MNE00341N, by Pan et al., the entire contents of which is incorporated herein by this reference. However, other logarithm converters and inverse logarithm converters with suitable accuracy and response times may also be used. For example, any of the logarithm converters or inverse logarithm converters described in the U.S. Pat. No. 5,553,012 or described in any of the following co-pending patent applications may be used: patent application Ser. Nos. 08/381,167, 08/381,368, 08/391,880, 08/508,365.

All of the above identified co-pending patent applications are incorporated by reference herein.

In addition, although several discrete logarithm/inverse logarithm converters have been disclosed, it is further contemplated that a shared logarithm or inverse logarithm converter could be used to perform more than one of the logarithm converter functions. For example, a single logarithm/inverse logarithm pair may be a shared resource with a time multiplexed input and a time de-multiplexed output. In this manner, the number of logarithm and inverse logarithm converters may be beneficially reduced leading to further reduced hardware costs.

During operation, a baseband signal 24, such as a digital baseband signal containing inphase and quadrature components, I, Q, is input to logarithm converter 70 and processed by the one bit shifter 72, antilog converter 74, accumulator 76, and register 78 to produce an amplitude signal 56, $I^2+Q^2$. The squaring operation is performed in the logarithm domain by the bit shifter 72, since a binary shift is the same as multiplying by 2 and since multiplying by 2 in the logarithm domain is equivalent to an exponentiation by a power of 2. A second logarithm domain function is performed by the predistortion module 60 which includes log converter 80, registers 82–90, multiplexer 92, zero pass shifters 94, 96, summers 98 and 102, right shifter 100, memory 104, and inverse logarithm converter 106 with output accumulator 108, 110.

The output 52 is then fed into the pulse width modulator which is preferably implemented as switch 112 driven by delay lock loop 46 and phase lock loop 48. The switch 112 produces a pulse width modulated signal 54.

In the lower portion of the digital processor 12, the baseband input signal 24 and an amplitude signal 113 from the predistortion module 60 are received by the multiplexor 114 and passed to the delay matching logarithm based functional unit. This logarithm based function unit includes the logarithm converter 116, summer 120, register 118, inverse log converter 130, accumulator 126 with register 128. The delay matching logarithm based functional unit approximates a sinusoidal function, such as a cosine function with a phase shift that is calculated to correspond to a time delay, T. In the preferred embodiment, the time delay T corresponds to an amount of time required so that the amplitude modulated signal 26 and phase signal 28 properly recombine in time synchronization at the power amplifier 18. The output 124 from the delay matching logarithm based module is received by the cosine approximation logarithm based processing unit including multiplexer 140, logarithm converter 142, summer 132, register 134, memory 138, inverse logarithm converter 144, and accumulator 146 with register 148. This logarithm based module approximates taking a cosine function of the signal 124 to produce cosine signal 149 which is fed to comparator 136. The comparator 136 amplitude limits cosine signal 148 and produces the amplitude limited frequency modulated signal 28.

Referring to FIG. 5, an alternative embodiment for the digital processor 12 is illustrated. Although the design of FIG. 5 is similar to that of FIG. 4, the delay compensation function is performed in the upper arm of the circuit of FIG. 5 instead of the lower arm as in FIG. 4.

The upper-arm is for envelope restoration and the lower-arm is for envelope elimination. The operation of the digital processor 12 in this embodiment is illustrated as follows:

Upper-Arm Operations

Logarithm unit 70 takes the logarithm of input signal 24. The input signal 24 is squared by a left shift operation at 72 and an anti-log function is performed to recover $I^2$ and $Q^2$ which are accumulated at 78. The log of the accumulated result is taken at log converter 80. Differential delays are determined from a delay of 0 to 4 via shift registers 82–90. The output from the shift registers 82–90 is fed to MUX 92 and output to two zero pass shift registers 94 and 96 to determine a different exponent operation of 0, 1, 3, and 5 in the adder 98. Further detail of this operation is shown in Table III as follows:

TABLE III

The Operation of the (ZP<<) (2)

| Operation: | {ZP<<} (1) | {ZP<<} (2) |
|---|---|---|
| $i^1$ | P | Z |
| $i^3$ | P | <<1 |
| $i^5$ | P | <<2 |

Next, a shift right is performed by shifter 100 for a square root operation and selected coefficients from memory 104 are added to each term of the polynomial to perform a pre-distortion operation. The coefficients a and b are then added to the output terms at summers 150 and 152 to handle delay compensation of the amplitude signal and the result is stored in registers 154 and 156. An anti-log operation is performed by inverse log converter 106 and accumulated in register 110 by summer 108 to produce a pre-distorted and delay compensated signal. This resulting signal is sent to the switch 112 to generate a pulse width modulation signal using the switch 112 together with the DLL 46 and PLL 48.

Lower-Arm Operations

The input signal 24 is converted to the logarithm domain by logarithm converter 70 and delay matched by the registers 160 to compensate for a delay amount that is equal to "top" of the upper-arm delay plus the filter delay. An arctangent operation is performed by adder 120 using coefficients from SRAM 162 that correspond to a Taylor series expansion of the arctan function to determine a phase angle of the input signal 24. The result from the adder 120 is then inverse log converted at inverse log converter 130 and accumulated at summer 126 and register 128 to compute a phase change in the input signal 24. A logarithm conversion at 142 is performed on the phase signal and coefficients from memory 138 corresponding to a Taylor series approximation of a cosine function are applied at adder 132. The result of the cosine approximation is produced after applying the inverse log conversion at 144. The results are accumulated at 146 and 148 for the cosine of the phase signal. It should be noted that the comparator 136 is not needed if the amplitude of the cosine signal is limited.

Figure 6:
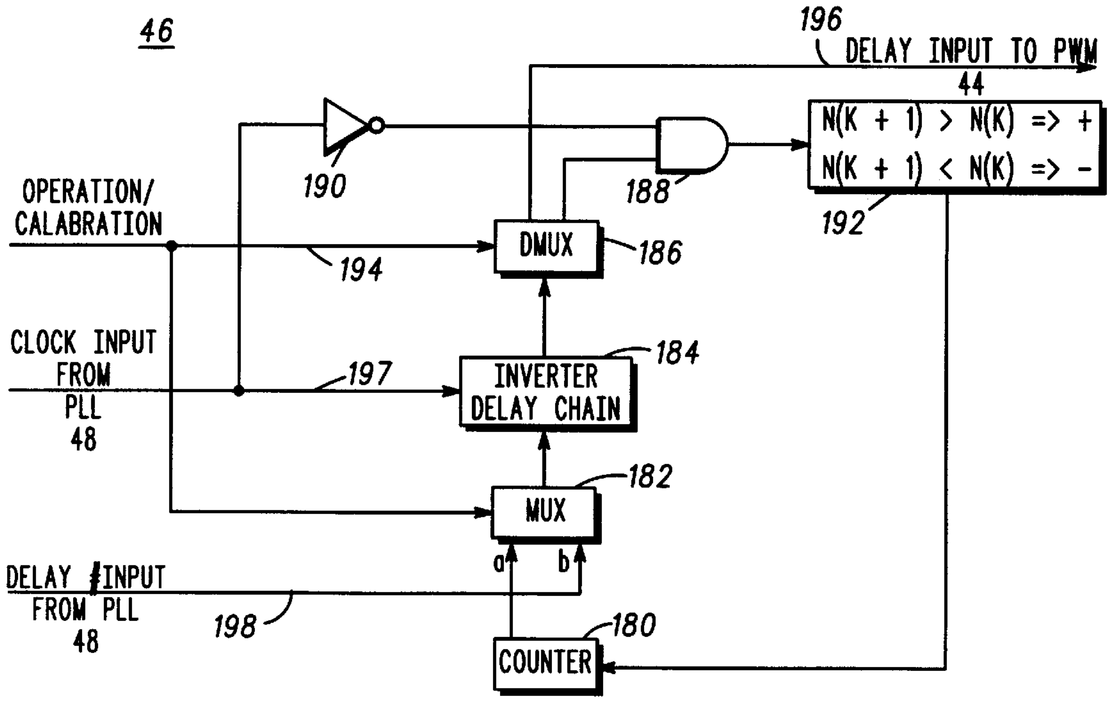
FIG. 6 is a block diagram of an embodiment of a delay lock loop found within the digital processor of FIG. 3.

Referring to FIG. 6, a block diagram of a delay lock loop (DLL) 46 is illustrated. DLL 46 includes a selectable delay unit 184, a multiplexor 182, a counter 180, a demultiplexor 186, an inverter 190, comparator 188, and decision logic 192. The DLL 46 is used to support the pulse width modulator function within the digital processor 12. The DLL 46 has a clock input 197, a numerical delay input 198, and a operation/calibration setting input 194. The DLL 46 produces a delayed digital output 196 that is fed to PWM 44.

Figure 7:
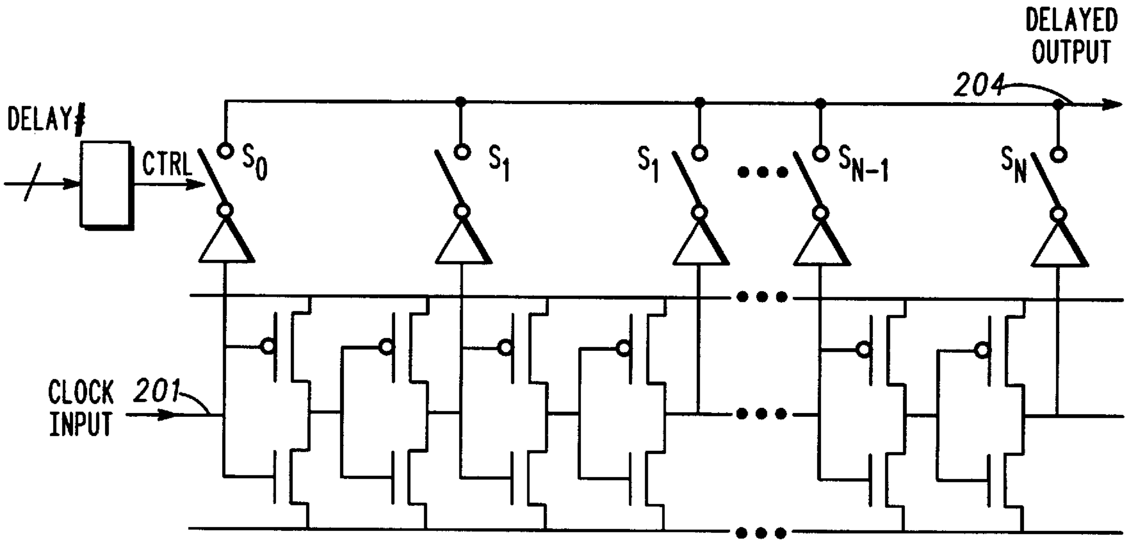
FIG. 7 is a schematic diagram of a delay chain within the delay lock loop of FIG. 6.

The delay unit 184 may be implemented as a plurality of inverters, as shown in more detail in FIG. 7. The delay unit 184 has two inputs, the clock input 197, and a numerical input selected by the multiplexor 182 originating from either the delay input 198 or the counter 180. The numerical input indicates a number of inverters used in the delay chain to provide a desired time delay. In the preferred embodiment, the counter 180 is a numerical asynchronous counter which may be 8 bits or more. The output of the delay unit 184 is then passed to DMUX 186 and then fed to either the output 196 or to comparator 188. The output of comparator 188 is fed to decision logic 192. The decision logic 192 is used to either increment or decrement the counter 180 in a feedback loop.

In FIG. 7, the input clock 201 is delayed by a series of inverter pairs. If the switch S1 is closed, the delayed output 204 is one inverter pair delayed from the input clock 202. If the switch S N−1 is closed, the delayed output 204 is N−1 inverter pairs delayed from the input clock 202.

In order to know the number of inverter pairs within a particular clock signal, a calibration circuit is designed into the DLL 46. When the operation/calibration input is set to the calibration mode, MUX 182 is switched to the a input, DMUX 186 is switched to the b input, and the counter 180 is initialized to 0. The inverse of the clock input and the delayed clock input from delay unit 184 are sent to the comparator 188. The output of the comparator 184 is then monitored by decision logic 192. If the previous output of the comparator 188 is higher than the current output, the counter will add one, otherwise, the counter will subtract one, as determined by logic unit 192. If the decision logic 192 produces alternating add and subtraction operations, then the calibration is finished. The output of the counter 180 at this time is the number of the inverter pairs inserted within a clock signal path. After calibration, any portion or fraction of the clock can be provided by the DLL 46, within the resolution of the circuit. For example, if a clock has 100 inverter pairs, a pulse signal have a width of 10% of a full clock can be provided by selecting a signal with 10 inverter pair delay at the DLL 46.

Figure 8:
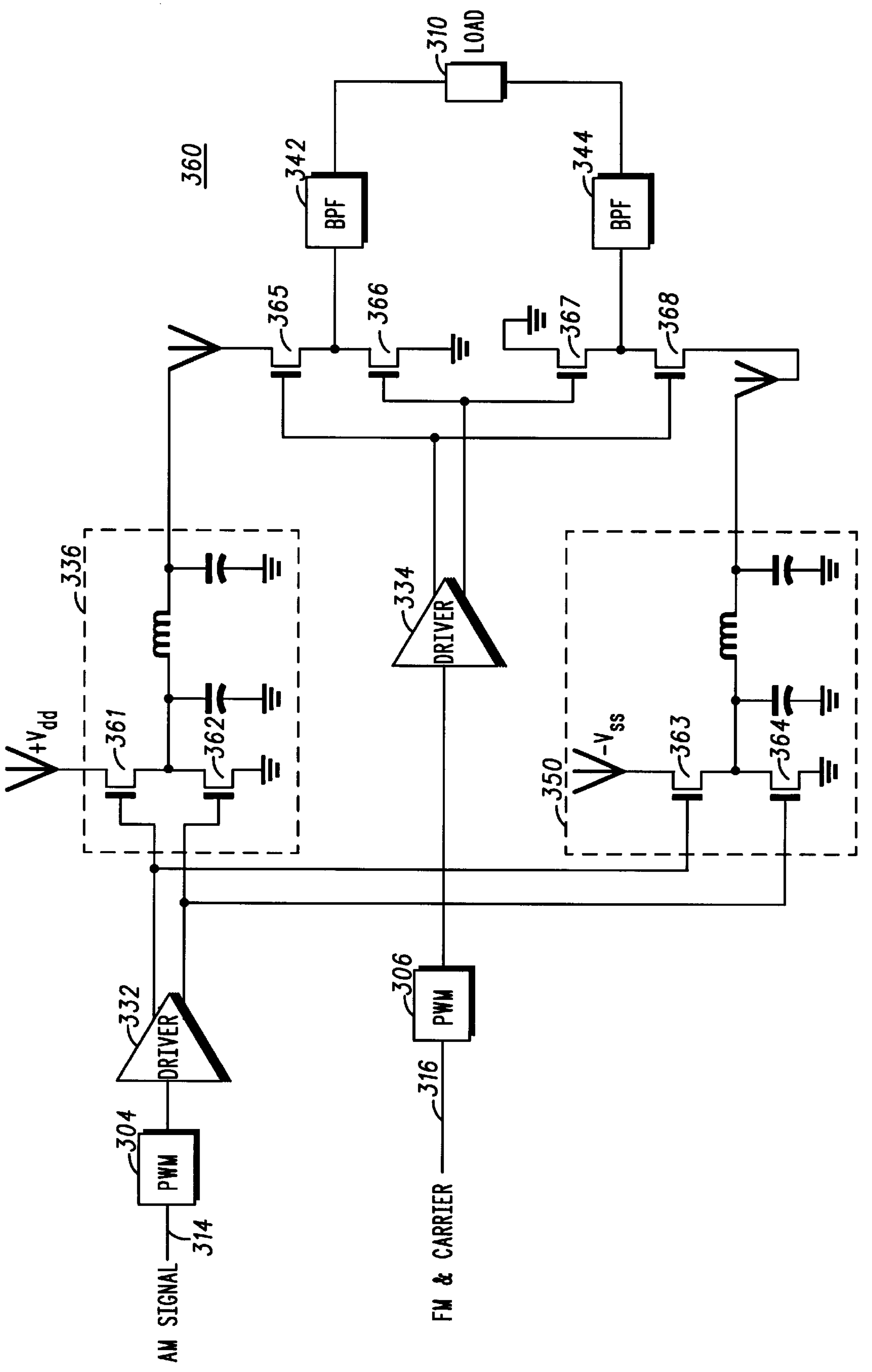
FIG. 8 is a schematic diagram of another embodiment of an electronic apparatus.

Referring to FIG. 8, another embodiment of an electronic apparatus 360 in accordance with the present invention is illustrated. The apparatus 360 includes first PWM 304, first driver 322, second PWM 306, second driver 334, first analog PWM 336, a second analog PWM 350, switching elements 365–368, first band pass filter 342, second band pass filter 344, and antenna 310. The first analog PWM 336 is supplied with positive voltage Vdd and the second analog PWM 350 is supplied with negative voltage −Vss.

During operation, the amplitude modulated signal 314 is digitally pulse width modulated by PWM 304, fed to driver 332, and passed to the first analog PWM 336 and to the second analog PWM 350. The switches 361 and 363 are controlled so that they function together, i.e. they are either both open or both closed at the same time. Similarly, switches 362 and 364 are controlled to function together. Switches 361, 363 are controlled to be in the opposite state as switches 362, 364. In this manner, the voltage from the output of the second analog PWM 350 is opposite to the voltage from the output of the first analog PWM 336. Switches 365–368 are driven by the high frequency signal (typically about 1 Ghz) from driver 334, which is preferably a frequency modulated carrier signal. The supply voltage from the switch 365 is from the first analog PWM 336 and the supply voltage from the switch 366 is from the second analog PWM 350. First and second band pass filters 342, 344, in response to the switching network 365–368 apply an amplitude modulated and frequency modulated combined signal to the load 310, which is preferably an antenna.

Since the pulse width modulators 304, 306 are implemented digitally using a digital type of circuit, the pulse width modulators 304, 306 produce less distortion than for comparable analog designs. In addition, apparatus using the digital pulse width modulators can be operated at a power delivery efficiency greater than 90% and up to 97% efficiency.

It will be apparent to those skilled in the art that the disclosed invention may be modified in numerous ways and may assume many embodiments other than the preferred form specifically set out and described above.

Accordingly, it is intended by the appended claims to cover all modifications of the invention which fall within the true spirit and scope of the invention.

What is claimed is:

1. An electronic apparatus comprising:

a digital processor producing a first digital signal and a second digital signal;

a first digital pulse width modulator responsive to the first digital signal;

a second digital pulse width modulator responsive to the second digital signal;

a first driver responsive to the first digital pulse width modulator;

a second driver responsive to the second digital pulse width modulator;

a first analog pulse width modulator responsive to the first driver;

a second analog pulse width modulator responsive to the first analog pulse width modulator and the second driver;

a switch capacitance responsive to the first analog pulse width modulator;

a first band pass filter responsive to the first analog pulse width modulator; and a second band pass filter responsive to the switch capacitance.

2. The electronic apparatus of claim 1, further comprising a load responsive to the first band pass filter and the second band pass filter.

3. The electronic apparatus of claim 1, wherein the first digital signal comprises an amplitude modulated signal and the second digital signal comprises a frequency modulated signal.

4. The electronic apparatus of claim 1, wherein the digital processor includes at least one of a logarithm converter and an inverse logarithm converter.

5. The electronic apparatus of claim 1, wherein the first driver and the second driver further comprise differential outputs.

6. The electronic apparatus of claim 1, wherein the first analog pulse width modulator further comprises a first switching element, a second switching element, and an output filter.

7. The electronic apparatus of claim 6, wherein the first switching element and the second switching element comprise field effect transistors.

8. The electronic apparatus of claim 6, wherein the output filter comprises a low pass filter.

9. The electronic apparatus of claim 1, wherein the first analog pulse width modulator comprises differential inputs.

10. The electronic apparatus of claim 1, wherein the second analog pulse width modulator comprises differential inputs.

11. The electronic apparatus of claim 1, wherein the second analog pulse width modulator further comprises a supply input coupled to the first analog pulse width modulator.

12. The electronic apparatus of claim 1, wherein the digital processor further comprises a predistortion generation module and a digital modulator.

13. The electronic apparatus of claim 1, wherein the digital processor computes a nonlinear polynomial function.

14. An electronic apparatus comprising:

a digital logarithm based processor including a logarithm converter, a digital logic circuit, and an inverse logarithm converter;

a first digital pulse width modulator responsive to the digital logarithm based processor;

a second digital pulse width modulator responsive to the digital logarithm based processor;

a first driver responsive to the first digital pulse width modulator;

a second driver responsive to the second digital pulse width modulator;

a first analog pulse width modulator responsive to the first driver;

a second analog pulse width modulator responsive to the first driver;

a first switching element responsive to the first analog pulse width modulator and to the second driver;

a second switching element responsive to the first switching element and the second driver;

a third switching element responsive to the second analog pulse width modulator and to the second driver;

a fourth switching element responsive to the third switching element and the second driver;

a first band pass filter responsive to the first and second switching elements; and a second band pass filter responsive to the third and fourth switching elements.

15. The electronic apparatus of claim 14, wherein the digital logarithm based processor includes a plurality of logarithm converters.

16. The apparatus of claim 14, wherein the digital logic circuit comprises one of a summer, a binary shifter, a register, a memory, and a multiplexer and further comprising an antenna responsive to the first and second bandpass filters.

17. An electronic apparatus comprising:

a first digital pulse width modulator receiving an amplitude modulated digital signal;

a second digital pulse width modulator receiving a frequency modulated digital signal;

a first driver responsive to the first digital pulse width modulator;

a second driver responsive to the second digital pulse width modulator;

a first analog pulse width modulator responsive to the first driver;

a second analog pulse width modulator responsive to the first analog pulse width modulator and the second driver;

a switch capacitance responsive to the first analog pulse width modulator;

a first band pass filter responsive to the first analog pulse width modulator; and a second band pass filter responsive to the switch capacitance.

18. The electronic apparatus of claim 17, further comprising an antenna responsive to the first and second bandpass filters.

19. The electronic apparatus of claim 17, wherein the first analog pulse width modulator comprises at least one filter.

* * * * *